US012713772B2

(12) United States Patent
Zhang et al.

(10) Patent No.: US 12,713,772 B2
(45) Date of Patent: Aug. 18, 2026

(54) OLED DISPLAY PANEL INCLUDING PIXEL DEFINITION LAYER HAVING PROTRUSIONS

(71) Applicant: Shenzhen China Star Optoelectronics Semiconductor Display Technology Co., Ltd., Shenzhen (CN)

(72) Inventors: Qianyi Zhang, Shenzhen (CN); Xingyu Zhou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 1015 days.

(21) Appl. No.: 17/764,696

(22) PCT Filed: Mar. 22, 2022

(86) PCT No.: PCT/CN2022/082169
§ 371 (c)(1),
(2) Date: Mar. 29, 2022

(87) PCT Pub. No.: WO2023/155266
PCT Pub. Date: Aug. 24, 2023

(65) Prior Publication Data

US 2024/0114722 A1 Apr. 4, 2024

(30) Foreign Application Priority Data

Feb. 18, 2022 (CN) ......................... 202210148417.7

(51) Int. Cl.
*H10K 59/12* (2023.01)
*H10K 59/122* (2023.01)
(Continued)

(52) U.S. Cl.
CPC ....... *H10K 59/122* (2023.02); *H10K 59/1201* (2023.02); *H10K 59/124* (2023.02);
(Continued)

(58) Field of Classification Search
CPC ............... H10K 59/122; H10K 59/124; H10K 59/8722; H10K 59/873; H10K 59/00; H10K 59/12; H10K 50/846; H10K 50/8426
See application file for complete search history.

(56) References Cited

U.S. PATENT DOCUMENTS 6,492,700 B1 12/2002 Lin et al.
2017/0294500 A1* 10/2017 Song .................... H10K 59/123
(Continued)

FOREIGN PATENT DOCUMENTS

CN 107104201 A 8/2017
CN 110136574 A 8/2019
(Continued)

OTHER PUBLICATIONS

Chinese Office Action issued in corresponding Chinese Patent Application No. 202210148417.7 dated Jun. 12, 2025, pp. 1-13.

*Primary Examiner* — Ida M Soward
(74) *Attorney, Agent, or Firm* — PV IP PC; Christopher S. Ruprecht; Wei Te Chung

(57) ABSTRACT

An OLED display panel and a fabrication method of the OLED display panel are provided. The OLED display panel includes a substrate, a planarization layer, a pixel definition layer, a cover plate, a first encapsulation part, and a second encapsulation part. The substrate includes a display area and a frame area. The pixel definition layer is provided with the first protrusion in the frame area, and at least a portion of the first protrusion is covered by the first encapsulation part.

18 Claims, 5 Drawing Sheets

(51) Int. Cl.
*H10K 59/124* (2023.01)
*H10K 59/80* (2023.01)

(52) U.S. Cl.
CPC ....... *H10K 59/8722* (2023.02); *H10K 59/873* (2023.02); *H10K 59/12* (2023.02)

(56) References Cited

U.S. PATENT DOCUMENTS

| | | | | |
|---|---|---|---|---|
| 2018/0033998 | A1* | 2/2018 | Kim | H10K 59/124 |
| 2018/0122890 | A1* | 5/2018 | Park | H10K 59/124 |
| 2018/0138450 | A1* | 5/2018 | Park | H10K 59/8731 |
| 2019/0363149 | A1* | 11/2019 | Okabe | H10K 59/873 |
| 2020/0194534 | A1* | 6/2020 | Park | H10K 59/124 |
| 2020/0295310 | A1* | 9/2020 | Moon | H10K 59/38 |
| 2021/0027672 | A1* | 1/2021 | Ma | G09G 5/006 |
| 2021/0036246 | A1* | 2/2021 | Fujiwara | H10K 59/873 |
| 2021/0271336 | A1* | 9/2021 | Yamanaka | H10K 59/40 |
| 2021/0376291 | A1* | 12/2021 | Park | H10K 59/88 |
| 2021/0384461 | A1* | 12/2021 | Kim | H10K 59/8722 |
| 2022/0077255 | A1* | 3/2022 | Li | H10K 59/1213 |
| 2022/0115452 | A1* | 4/2022 | Hou | H10K 71/80 |
| 2022/0115469 | A1* | 4/2022 | Huang | H10K 59/80521 |
| 2022/0344419 | A1* | 10/2022 | Wang | H10K 59/80515 |
| 2024/0016004 | A1* | 1/2024 | Song | H10K 59/873 |
| 2024/0023381 | A1* | 1/2024 | Huang | H10K 59/38 |

FOREIGN PATENT DOCUMENTS

| | | | | | |
|---|---|---|---|---|---|
| CN | 110335959 | A | | 10/2019 | |
| CN | 110416434 | A | | 11/2019 | |
| CN | 110854289 | A | | 2/2020 | |
| CN | 111063822 | A | | 4/2020 | |
| CN | 111326636 | A | * | 6/2020 | H10K 59/8792 |
| CN | 111430571 | A | * | 7/2020 | H10K 50/854 |
| CN | 211088277 | U | | 7/2020 | |
| CN | 111584750 | A | | 8/2020 | |
| CN | 108962953 | B | * | 11/2020 | H10K 50/84 |
| CN | 112563432 | A | * | 3/2021 | H10K 59/124 |
| CN | 113299702 | A | | 8/2021 | |
| CN | 214043668 | U | | 8/2021 | |
| KR | 100796618 | B1 | * | 1/2008 | H10K 59/12 |
| KR | 20130030148 | A | * | 3/2013 | G02B 5/30 |
| KR | 20160066650 | A | * | 6/2016 | H10K 59/805 |
| WO | WO-2020238467 | A1 | * | 12/2020 | H10K 59/873 |
| WO | 2021093031 | A1 | | 5/2021 | |

* cited by examiner 100
60
50
11
73
82
12
35
40
31
30
20
90
81
10
91
32
71
72

OLED DISPLAY PANEL INCLUDING PIXEL DEFINITION LAYER HAVING PROTRUSIONS

FIELD OF INVENTION

The present application relates to a field of display technology, and particularly to an organic light emitting diode (OLED) display panel and a fabrication method of the OLED display panel.

BACKGROUND

An organic light emitting diode (OLED) is a current-type light-emitting device, and the OLED mainly comprises an anode, a cathode and functional layers of organic materials. The main working principle of the OLED is that the organic material functional layers emit light through carrier injection and recombination under driving of an electric field formed by the anode and the cathode.

The existing OLED display panel comprises a thin film transistor (TFT) array substrate including a TFT driving circuit, and a plurality of OLED display devices arranged on the TFT array substrate. Each OLED display device is controlled by a corresponding TFT. Packaging of OLED generally uses metal film packaging to block water and oxygen intrusion, which has a good blocking effect, and it is widely used in small and medium-sized products. However, metal film encapsulation can only be used in electroluminescent products with bottom emission structure. For electroluminescent products with higher color gamut requirements, top emission backplate structure is generally used. Due to poor light transmittances of metal film, OLED light output will be affected. Therefore, in the electroluminescent products of the emissive backplate structure, the encapsulation method of frame glue and filling glue is generally used.

In the packaging method of frame glue and filling glue, the frame glue material is generally attached to the inorganic film, but in the process of making the backplate, a planarization layer needs to be made. The planarization layer is still an inorganic material, and it is easy to stick to the frame glue material. Residues appear on the inorganic film in the bonding area, resulting in poor sealing performance of the frame glue. In addition, in order to ensure the effect of absorbing water and oxygen, a moisture-absorbing glue will be provided between the frame glue and the filling glue, but the moisture-absorbing glue is unstable above the planarization layer and has poor sealing, which easily leads to water and oxygen intrusion.

SUMMARY OF DISCLOSURE

The present application provides an OLED display panel and a fabrication method of the OLED display panel, so as to improve the sealing property of the encapsulation of the display panel.

The present application provides an OLED display panel, comprising:

- a substrate, wherein the substrate comprises a display area and a frame area arranged on a periphery of the display area;
- a planarization layer, wherein the planarization layer is provided on the substrate;
- a pixel definition layer, wherein the pixel definition layer is provided on the planarization layer, and the pixel definition layer is provided with a first protrusion in the frame area;

- a cover plate, wherein the cover plate is located on a side of the substrate where the pixel definition layer is provided, and is disposed opposite to the substrate;
- a first encapsulation part, wherein the first encapsulation part is filled between the pixel definition layer and the cover plate and extends from the display area to the frame area, and the first encapsulation part at least covers a portion of the first protrusion; and
- a second encapsulation part, wherein the second encapsulation part is filled between the pixel definition layer and the cover plate and is arranged around the first encapsulation part.

Optionally, in some embodiments of the present application, the planarization layer is provided with a second protrusion in the frame area, and the pixel definition layer covers the second protrusion in the frame area.

Optionally, in some embodiments of the present application, the pixel definition layer comprises a first pixel definition layer and a second pixel definition layer, and the first pixel definition layer covers the planarization layer, the second pixel definition layer is disposed on the first pixel definition layer and located in the display area, and the first pixel definition layer is provided with a first protrusion in the frame area.

Optionally, in some embodiments of the present application, the material of the first pixel definition layer is an inorganic material.

Optionally, in some embodiments of the present application, the material of the second pixel definition layer is an organic material.

Optionally, in some embodiments of the present application, the OLED display panel further comprises a first electrode layer, the first electrode layer is provided on the planarization layer, the pixel definition layer is provided on the a first electrode layer, the first electrode layer comprises an anode and a second protrusion, the pixel definition layer is provided with an opening in the display area, the anode is arranged in the opening, and the second protrusion is located in the frame area, and a portion of the pixel definition layer in the frame area covers the second protrusion.

Optionally, in some embodiments of the present application, the planarization layer is provided with a second protrusion in the frame area, and a portion of the pixel definition layer in the frame area covers the second protrusion.

Optionally, in some embodiments of the present application, the first protrusion covers the second protrusion.

Optionally, in some embodiments of the present application, the number of the first protrusion is at least two, a portion located between adjacent first protrusions of the pixel definition layer is a recessed portion, and the recessed portion covers the second protrusion.

Optionally, in some embodiments of the present application, the second encapsulation part comprises a frame glue, and the first encapsulation part comprises a filling glue.

Optionally, in some embodiments of the present application, the first encapsulation part further comprises a moisture-absorbing glue, the moisture-absorbing glue is filled in the frame area, and the second encapsulation part is located in the frame area and arranged around the filling glue and the moisture-absorbing glue.

Optionally, in some embodiments of the present application, the moisture-absorbing glue is disposed between the second encapsulation part and the filling glue, and the moisture-absorbing glue is filled between the pixel definition layer and the cover plate and covers at least a portion of the first protrusion, and the filling glue covers a rest portion of the first protrusion.

Optionally, in some embodiments of the present application, the filling glue extends from the display area to the frame area and is abutted against the second encapsulation part, and the moisture-absorbing glue is filled between a portion of the filling glue in the frame area and the pixel definition layer, and the moisture-absorbing glue covers the first protrusion.

Moreover, the present application further provides a fabrication method of an OLED display panel, comprising following steps:

- providing a substrate, wherein the substrate comprises a display area and a frame area arranged on a periphery of the display area;
- forming a planarization layer on the substrate;
- forming a pixel definition layer on the planarization layer, wherein the pixel definition layer is provided with a first protrusion in the frame area;
- providing a cover plate, forming an encapsulation material on the cover plate, aligning and pressing the cover plate and the substrate together in a manner that the encapsulation material is located between the cover plate and the substrate, and curing the encapsulation material to form a second encapsulation part and a first encapsulation part, wherein the first encapsulation part is filled between the pixel definition layer and the cover plate and extends from the display area to the frame area, the second encapsulation part is filled between the pixel definition layer and the cover plate and is disposed around the first encapsulation part, and the first encapsulation part at least partially covers the first protrusion.

Moreover, the present application further provides an OLED display panel, comprising:

- a substrate, wherein the substrate comprises a display area and a frame area arranged on a periphery of the display area;
- a planarization layer, wherein the planarization layer is provided on the substrate;
- a pixel definition layer, wherein the pixel definition layer is provided on the planarization layer, and the pixel definition layer is provided with a first protrusion in the frame area;
- a cover plate, wherein the cover plate is located on a side of the substrate where the pixel definition layer is provided, and is disposed opposite to the substrate;
- a first encapsulation part, wherein the first encapsulation part is filled between the pixel definition layer and the cover plate and extends from the display area to the frame area, and the first encapsulation part at least covers a portion of the first protrusion; and
- a second encapsulation part, wherein the second encapsulation part is filled between the pixel definition layer and the cover plate and is arranged around the first encapsulation part, and moisture-absorbing particles are added in the second encapsulation part.

Optionally, in some embodiments of the present application, the OLED display panel further comprises a first electrode layer, the first electrode layer is provided on the planarization layer, the pixel definition layer is provided on the a first electrode layer, the first electrode layer comprises an anode and a second protrusion, the pixel definition layer is provided with an opening in the display area, the anode is arranged in the opening, and the second protrusion is located in the frame area, and a portion of the pixel definition layer in the frame area covers the second protrusion.

Optionally, in some embodiments of the present application, the planarization layer is provided with a second protrusion in the frame area, and a portion of the pixel definition layer in the frame area covers the second protrusion in the frame area.

Optionally, in some embodiments of the present application, the first protrusion covers the second protrusion.

Optionally, in some embodiments of the present application, the number of the first protrusion is at least two, and the pixel definition layer located at a position between the adjacent first protrusions is a recessed portion, and the recessed portion covers the second protrusion.

Optionally, in some embodiments of the present application, the second encapsulation part comprises a frame glue, and the first encapsulation part comprises a filling glue.

Optionally, in some embodiments of the present application, the first encapsulation part further comprises a moisture-absorbing glue, the moisture-absorbing glue is filled in the frame area, and the second encapsulation part is located in the frame area and arranged around the filling glue and the moisture-absorbing glue.

Optionally, in some embodiments of the present application, the moisture-absorbing glue is disposed between the second encapsulation part and the filling glue, and the moisture-absorbing glue is filled between the pixel definition layer and the cover plate and covers at least a portion of the first protrusion, and the filling glue covers a rest portion of the first protrusion.

Optionally, in some embodiments of the present application, the filling glue extends from the display area to the frame area and is abutted against the second encapsulation part, and the moisture-absorbing glue is filled between a portion of the filling glue in the frame area and the pixel definition layer, and the moisture-absorbing glue covers the first protrusion.

The present application provides an OLED display panel and a fabrication method of the OLED display panel. The OLED display panel comprises a substrate, the substrate comprises a display area and a frame area disposed on the peripheral side of the display area; a planarization layer, the planarization layer is disposed on the substrate; a pixel definition layer, the pixel definition layer The pixel definition layer is provided on the planarization layer, and the pixel definition layer is provided with a first protrusion in the frame area; a cover plate is located on the side of the substrate on which the pixel definition layer is provided, and is connected with the pixel definition layer. the substrates are arranged opposite to each other; a first encapsulation part, the first encapsulation part is filled between the pixel definition layer and the cover plate and extends from the display area to the frame area, the first encapsulation part covers at least a portion of the first protrusion; and a second encapsulation part is filled between the pixel definition layer and the cover plate and disposed around the first encapsulation part. In the present application, a pixel definition layer is used to provide a first protrusion in the frame area, and then at least a part of the first protrusion is covered by the first encapsulation part, so that the first encapsulated portion can stand firmly above the planarization layer without the inclination, thereby improving the sealing performance of the package and avoiding the intrusion of water and oxygen. In addition, the first protrusion is fabricated on the same layer of the pixel definition layer, and no new film layer structure or film layer material is required, which reduces the cost.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
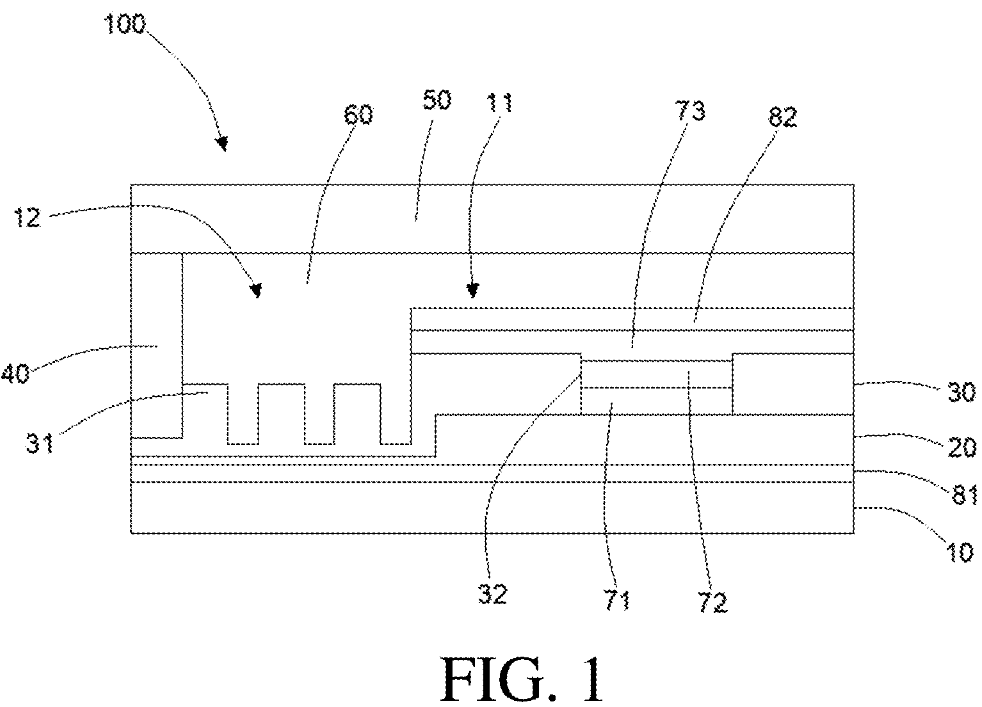
FIG. 1 is a schematic diagram of a first structure of an OLED display panel provided by the present application.

Technical solutions in the embodiments of the present application will be clearly and completely described below with reference to the accompanying drawings in the embodiments of the present application. Obviously, the described embodiments are only a part of the embodiments of the present application, but not all of the embodiments. Based on the embodiments in this application, all other embodiments obtained by those skilled in the art without creative efforts shall fall within the protection scope of this application.

In the description of this application, it should be understood that the directions or positional relationships indicated by the terms “upper”, “lower”, “far away”, “near”, etc. are based on the directions or positional relationships shown in the drawings, for example, ““Upper” only means that the surface is above the object, and specifically refers to directly above, obliquely above, or the upper surface, as long as it is above the level of the object. The upper position or positional relationship is only for the convenience of describing the application and simplifying the description, and is not an indication It may also imply that the device or element referred to must have a specific orientation, be constructed and operated in a specific orientation, and therefore cannot be understood as a limitation of the present application. In addition, the terms “first”, “second” and the like in the description and claims of the present application are used to distinguish different objects, rather than to describe a specific order. The terms “comprising” and “having”, and any variations thereof, are intended to cover non-exclusive inclusion.

The present application provides an OLED display panel 100 and a fabrication method of the OLED display panel 100, which will be described in detail below. It should be noted that the description order of the following embodiments is not intended to limit the preferred order of the embodiments of the present application.

Please refer to FIG. 1, which is a schematic diagram of a first structure of an OLED display panel 100 provided by the present application. The present application provides an OLED display panel 100, comprising a substrate 10, a planarization layer 20, a pixel definition layer 30, a cover plate 50, a first encapsulation part 60 and a second encapsulation part 40.

The substrate 10 comprises a display area 11 and a frame area 12 disposed on a periphery of the display area 11. The substrate may be a flexible substrate including a single flexible organic layer or two or more flexible organic layers. The flexible organic layer comprises one or more of material selected from a group consisting of polyimide, polyethylene naphthalate, polyethylene terephthalate, polyarylate, polycarbonate, polyetherimide and polyethersulfone.

The planarization layer 20 is provided on the substrate 10. A material of the planarization layer 20 may be selected from silicon dioxide, nitrogen dioxide, silicon oxynitride and a laminate thereof, or an organic material, for example an acrylic resin.

The pixel definition layer 30 is provided on the planarization layer 20, and the pixel definition layer 30 is provided with a first protrusion 31 in the frame area 12.

The cover plate 50 is located on a side of the substrate 10 where the pixel definition layer 30 is provided, and is opposite to the substrate 10. The cover plate 50 may be a transparent glass, a transparent plastic or a metal cover plate 50, and the cover plate 50 is used to protect other elements of the OLED display panel 100.

The first encapsulation part 60 is filled between the pixel definition layer 30 and the cover plate 50 and extends from the display area 11 to the frame area 12, and the first encapsulation part 60 at least covers a portion of the first protrusion 31. The second encapsulation part 40 is filled between the pixel definition layer 30 and the cover plate 50 and is disposed around the first encapsulation part 60. The first encapsulation part 60 and the second encapsulation part 40 are used for adhering to the substrate 10 and the cover plate 50 for encapsulating thereof, while preventing the intrusion of water vapor.

In the present application, the first protrusion 31 is provided in the frame area 12 through the pixel definition layer 30, and then the first protrusion 31 is covered by the first encapsulating portion 60, so that the first encapsulating portion can stably stand above the planarization layer 20 and will not tilt, so as to improve the sealing performance of the package and avoid the intrusion of water and oxygen. In addition, the first protrusion 31 is fabricated on the same layer of the pixel definition layer 30, and no new film layer structure or new film layer material is required, thereby reducing the fabrication cost.

In some embodiments, the number of the first protrusion 31 is at least two, and a distance between the adjacent first protrusions 31 is equal to or greater than 500 microns. For example, the number of the first protrusions 31 is three, and the distance between the adjacent first protrusions 31 is 600 microns. A shape of the first protrusion 31 may be a protruding structure with a square cross-section, or a protruding structure with a triangular or other polygonal cross-section.

Furthermore, in some embodiments, a thickness of the planarization layer 20 in the display area 11 is greater than a thickness of the planarization layer 20 in the frame area 12.

By designing the thickness of the planarization layer 20 in the display area 11 to be larger than the thickness of the planarization layer 20 in the frame area 12, sufficient packaging space can be left for the frame area 12, which is beneficial to reduce an overall thickness of the display panel.

Further, in some embodiments, the thickness of the pixel definition layer 30 in the display area 11 is greater than the thickness of the pixel definition layer 30 in the frame area 12.

In some embodiments, the OLED display panel 100 further comprises a first passivation layer 81 located between the substrate 10 and the planarization layer 20. The first passivation layer converts a metal surface of the substrate 10 into a state that is not easily oxidized, thereby slowing down a corrosion rate. The first passivation layer 81 comprises an inorganic layer or an organic layer. A material of the inorganic layer may be selected from aluminum oxide, silicon oxide, silicon nitride, silicon oxynitride, silicon carbide, titanium oxide, zirconium oxide, zinc oxide, and the like. A material of the organic layer may be selected from epoxy resin, polyimide, polyethylene terephthalate, polycarbonate, polyethylene, polyacrylate and the like.

In some embodiments, the OLED display panel 100 further comprises an organic light-emitting device, the organic light-emitting device comprises an anode 71, a cathode 73, and an organic light-emitting part 72 disposed between the anode 71 and the cathode 73. The pixel definition layer 30 in the display area 11 is provided with an opening 32, the anode 71 and the organic light emitting part 72 are arranged in the opening 32, and the cathode 73 covers the pixel definition layer 30 and is connected to the organic light emitting part 72 through the opening 32. The OLED The display panel 100 further comprises a second passivation layer 82 covering the cathode 73. The second passivation layer 82 is located in the display area 11 and covers the cathode 73. Specifically, an orthographic projection of the second passivation layer 82 on the cathode 73 covers the cathode 73, the second passivation layer 82 transforms a metal surface of the cathode 73 in a state that is not easily oxidized, and a corrosion rate is slowed down. The second passivation layer comprises an inorganic layer or an organic layer. The material of the inorganic layer may be selected from aluminum oxide, silicon oxide, silicon nitride, silicon oxynitride, silicon carbide, titanium oxide, zirconium oxide, zinc oxide, or the like. The material of the organic layer may be selected from epoxy resin, polyimide, polyethylene terephthalate, polycarbonate, polyethylene, polyacrylate or the like.

In some embodiments, the second encapsulation part 40 comprises a frame glue, and the first encapsulation part 60 comprises a filling glue. The filling glue comprises an organic material such as epoxy resin or acrylic resin. The frame glue comprises an organic material such as epoxy resin and acrylic resin. The frame glue can be a resin material with a high-water resistance. The high-water resistance refers to that the water and oxygen permeability of the frame glue is less than or equal to 60 $g/(m^2 \cdot 24\ h)$. The filling glue has a first viscosity, the frame glue has a second viscosity, and the first viscosity is less than the second viscosity. For example, the filling glue is liquid, and the frame glue is solid, which is a paste.

Furthermore, in some embodiments, moisture-absorbing particles are added in the second encapsulation part 40, and the moisture-absorbing particles can absorb water vapor entering the OLED display panel 100 from the outside.

Figure 2:
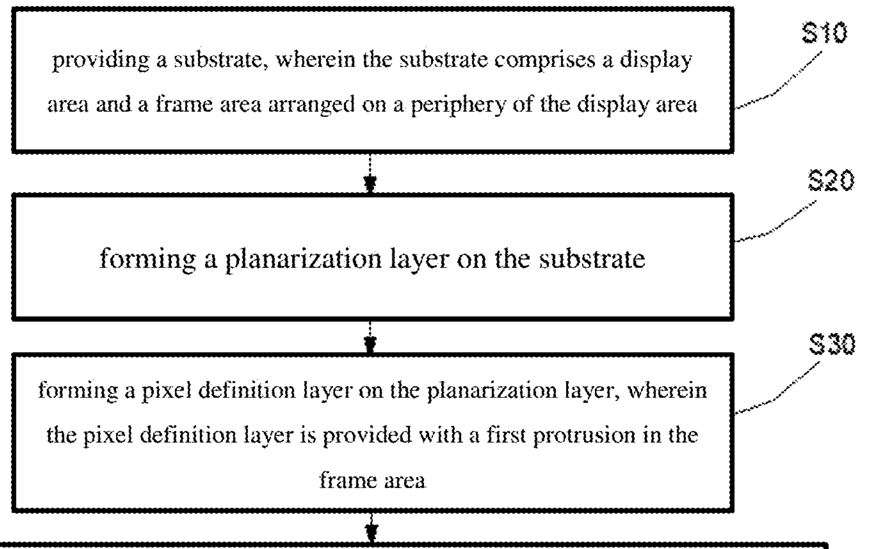
FIG. 2 is a flowchart of a first embodiment of a fabrication method of an OLED display panel provided by the present application.

Please refer to FIG. 2, which is a flowchart of a first embodiment of a fabrication method of the OLED display panel 100 of the present application. The present application also provides a fabrication method of the OLED display panel 100, which comprises following steps:

Step S10: providing a substrate 10, wherein the substrate 10 comprises a display area 11 and a frame area 12 disposed on a periphery of the display area 11;

Step S20: fabricating a planarization layer 20 on the substrate 10;

Step S30: forming a pixel definition layer 30 on the planarization layer 20, wherein the pixel definition layer 30 is provided with a first protrusion 31 in the frame area 12;

Step S40: providing a cover plate 50, forming a packaging material on the cover plate 50, positioning and pressing the cover plate 50 and the substrate in a manner that the packaging material is located between the cover plate 50 and the substrate 10, curing the encapsulation material to form the second encapsulation part 40 and the first encapsulation part 60, wherein the first encapsulation part 60 is filled between the pixel definition layer 30 and the cover plate 50 and extends from the display area 11 to the frame area 12, the second encapsulation part 40 is filled between the pixel definition layer 30 and the cover plate 50 and is disposed around the first encapsulation part 60, so the first encapsulation part 60 covers at least a portion of the first protrusion 31.

Figures 3, 4:
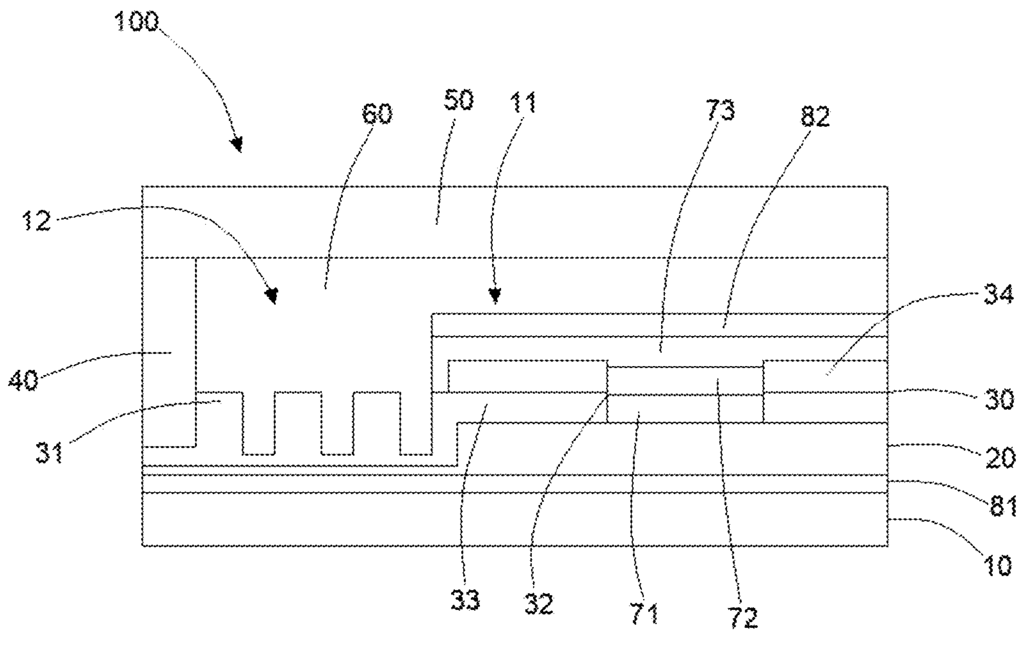
FIG. 3 is a schematic diagram of a second structure of an OLED display panel provided by the application.
FIG. 4 is a schematic diagram of a third structure of an OLED display panel provided by the present application.

Please refer to FIG. 3, which is a schematic diagram of a second structure of an OLED display panel 100 provided by the present application. The difference between this embodiment and the OLED display panel 100 provided in FIG. 1 is that the pixel definition layer 30 comprises a first pixel definition layer 33 and a second pixel definition layer 34. The first pixel definition layer 33 covers the planarization layer 20, and the second pixel definition layer 34 is provided on the first pixel definition layer 33 and located in the display area 11. The first pixel definition layer 33 is provided with a first protrusion 31 in a portion of the frame area 12.

In the present application, the pixel definition layer 30 is configured as a structure composed of the first pixel definition layer 33 and the second pixel definition layer 34, and only the first pixel definition layer 33 covers both the display area 11 and the border area 12, which is conducive to optimizing the display. The thickness of the display panel is reduced according to the design of the panel, and the first pixel definition layer 33 and the second pixel definition layer 34 may adopt different material structures.

In addition, the material of the first pixel definition layer 33 is an inorganic material, and the material of the second pixel definition layer 34 is an organic material. The inorganic material may be selected from aluminum oxide, silicon oxide, silicon nitride, silicon oxynitride, silicon carbide, titanium oxide, zirconium oxide, zinc oxide, or the like. The organic material may be selected from epoxy, polyimide, polyethylene terephthalate, polycarbonate, polyethylene, polyacrylate, or the like. Of course, when the first pixel definition layer 33 and the second pixel definition layer 34 are made of different materials, the material of the first pixel definition layer 33 may also be an organic material, and the material of the second pixel definition layer 34 may also be an inorganic material. In addition, in other embodiments of the present application, the first pixel definition layer 33 and the second pixel definition layer 34 may also use the same or the same type of materials, that is, the first pixel definition layer 33 and the second pixel definition layer 34 use organic materials at the same time, or the materials of the first pixel definition layer 33 and the second pixel definition layer 34 are the same, and the second pixel definition layer 34 uses organic materials that are compatible with the printing ink, preventing the ink for printing the light-emitting layer from overflowing and ensuring an uniformity of ink film formation.

Please refer to FIG. 4, which is a schematic diagram of a third structure of an OLED display panel 100 provided by the present application. The difference between this embodiment and the OLED display panel 100 provided in FIG. 1 is that the OLED display panel 100 further comprises an electrode layer 90. The first electrode layer 90 is disposed on the planarization layer 20. The first electrode layer 90 comprises an anode 71 and a second protrusion 91, the pixel definition layer 30 is in the display area 11 is provided with an opening 32, and the anode 71 is disposed in the opening 31. The second protrusion 91 is located in the frame area 12, and the part of the pixel definition layer 30 in the frame area 12 covers the second protrusion 91.

The first electrode layer 90 of the present application comprises the anode 71 and the second protrusion 91 disposed on the same layer, and the pixel definition layer 30 covers the second protrusion 91, which is beneficial to improve the performance of the adhesive properties of the pixel definition layer 30 in the frame area 12, and prevent the pixel definition layer 30 from shifting or slipping. In addition, there is no need to add a new film layer structure or film layer material, which is beneficial to reduce costs.

In some embodiments, a shape of the second protrusion 91 may be a protruding structure with a square cross-section, or may be a protruding structure with a triangular or other polygonal cross-section. The protruding structure can further improve degrees of the adhesion and bonding between the pixel definition layer 30 and the second protrusion 91, while preventing the pixel definition layer 30 from shifting or sliding.

Furthermore, in some embodiments, the first protrusion 31 covers the second protrusion 91, and the second protrusion 91 can have a higher height by covering the second protrusion 91 with the first protrusion 31, which does not affect the thickness of the display panel, and can increase the contact area between the first protrusion 31 and the second protrusion 91, further improving adhesion between the pixel definition layer 30 and the second protrusion 91. Preferably, the first protrusion 31 and the second protrusion 91 have the same shape, for example, the first protrusion 31 and the second protrusion 91 are both cylindrical. In other embodiments of the present application, the first protrusion 31 and the second protrusion 91 may also have different shapes.

Figures 5, 6:
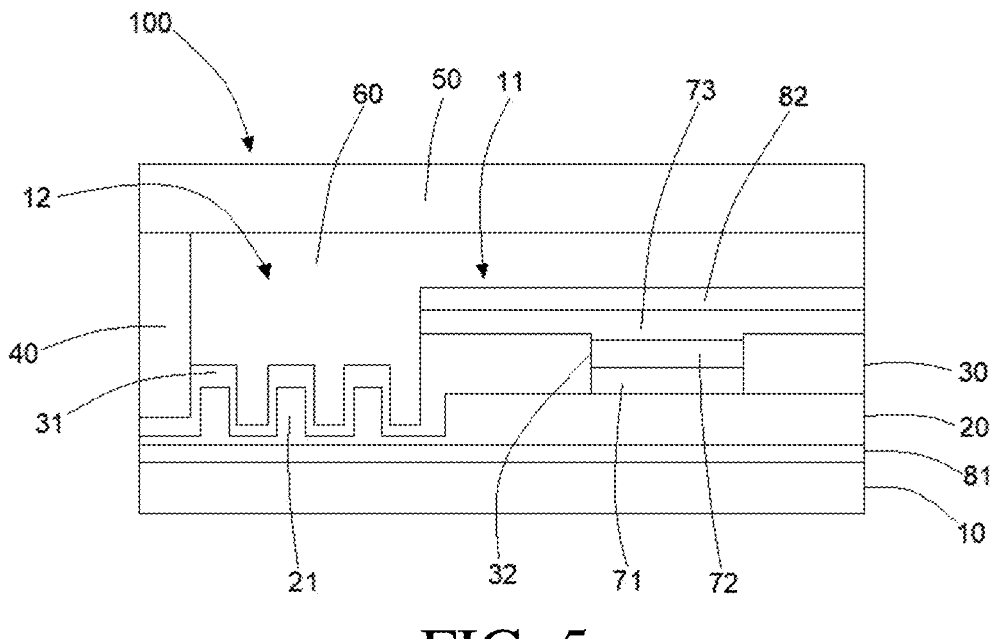
FIG. 5 is a schematic diagram of a fourth structure of an OLED display panel provided by the present application.
FIG. 6 is a schematic diagram of a fifth structure of an OLED display panel provided by the present application.

Please refer to FIG. 5. FIG. 5 is a schematic diagram of a fourth structure of an OLED display panel 100 provided by the present application. The difference between this embodiment and the OLED display panel 100 provided in FIG. 1 is that the planarization layer 20 is located on the frame area 12 is provided with a second protrusion 21, and a part of the pixel definition layer 30 in the frame area 12 covers the second protrusion 21.

In the present application, by providing the second protrusion 21 of the planarization layer 20 in the frame area 12 and covering the second protrusion 21 with the pixel definition layer 30, which is beneficial to improve the adhesion performance of the pixel definition layer 30 in the frame area 12 and prevent the pixel definition layer 30 from shifting or sliding. In addition, there is no need to add a new film layer structure or film layer material, which is beneficial to reduce costs.

In some embodiments, the shape of the second protrusion 21 may be a protruding structure with a square cross-section, or may be a protruding structure with a triangular or other polygonal cross-section. The protruding structure can further improve the adhesion and bonding degree between the pixel definition layer 30 and the second protrusion 21, while preventing the pixel definition layer 30 from shifting or sliding.

Furthermore, in some embodiments, the first protrusion 31 covers the second protrusion 21, and the second protrusion 21 can have a higher height by covering the second protrusion 21 with the first protrusion 31, which can increase the contact area between the first protrusion 31 and the second protrusion 21 and further improve the adhesive force between the pixel definition layer 30 and the second protrusion 21. Preferably, the first protrusion 31 and the second protrusion 21 have the same shape, for example, the first protrusion 31 and the second protrusion 21 are both cylindrical. In other embodiments of the present application, the first protrusion 31 and the second protrusion 21 may also have different shapes.

Please refer to FIG. 6. FIG. 6 is a schematic diagram of a fifth structure of an OLED display panel 100 provided by the present application. The difference between this embodiment and the OLED display panel 100 provided by FIG. 4 is that the number of the pixel definition layer 30 is at least two, and a portion located between adjacent first protrusions 31 of the pixel definition layer 30 is a recessed portion 35. The recessed portion 35 covers the second protrusion 91.

Through covering the second protrusions 91 with the recesses 35, not only the adhesion between the pixel definition layer 30 and the second protrusions 91 is increased, but also the space occupied by the second protrusions 91 is reduced, thereby avoiding the packaging space of the frame area 12 being affected by the second protrusions 91.

Figure 7:
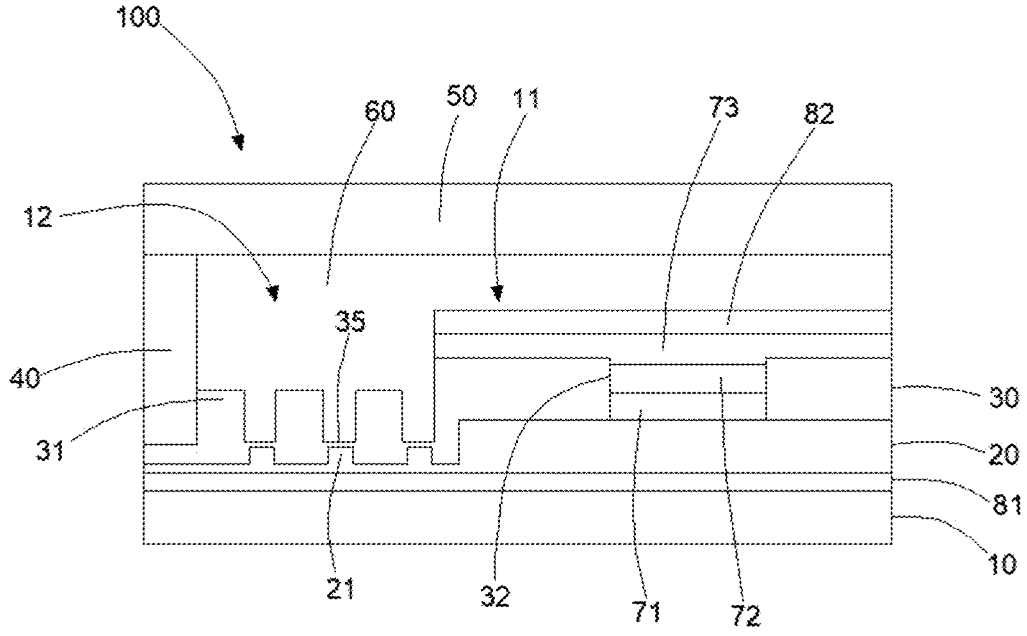
FIG. 7 is a schematic diagram of a sixth structure of an OLED display panel provided by the present application.

Please refer to FIG. 7. FIG. 7 is a schematic diagram of a sixth structure of an OLED display panel 100 provided by the present application. The difference between this embodiment and the OLED display panel 100 provided in FIG. 5 is that the number of the pixel definition layer 30 is at least two, and a portion located between adjacent first protrusions 31 of the pixel definition layer is a recessed portion 35. The recessed portion 35 covers the second protrusion 21.

Through covering the second protrusion 21 with the recessed portion 35 can not only improve the adhesion between the pixel definition layer 30 and the second protrusion 21, but also reduce the space occupied by the second protrusion 21 and avoid the second protrusion 21 from affecting the packaging space of the frame area 12.

Figure 8:
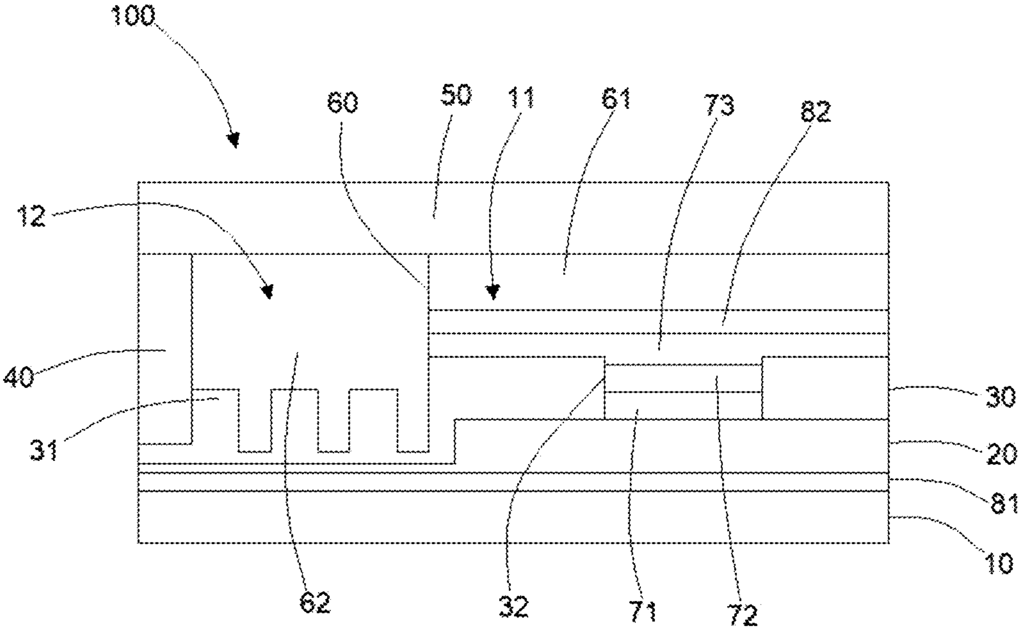
FIG. 8 is a schematic diagram of a seventh structure of an OLED display panel provided by the present application.

Please refer to FIG. 8, which is a schematic diagram of a seventh structure of an OLED display panel 100 provided by the present application. The difference between this embodiment and the OLED display panel 100 provided in FIG. 1 is that the first encapsulation part 60 further comprises a moisture-absorbing glue 62, the moisture-absorbing glue 62 is filled in the frame area 12, and the second encapsulation part 40 is located in the frame area 12 to surround the filling glue 61 and the moisture-absorbing glue 62.

In the present application, a moisture-absorbing glue 62 is provided, wherein the filling glue 61 is used to encapsulate the organic light-emitting device and provide mechanical strength to the OLED display panel 100, and the second encapsulation part 40 is used to bond the substrate 10 and the cover plate 50 and prevent the intrusion of water vapor. The moisture-absorbing adhesive 62 is used for absorbing water vapor entering the organic light emitting display panel from the outside.

Furthermore, in some embodiments, the moisture-absorbing glue 62 is disposed between the second encapsulation part 40 and the filling glue 61, and the moisture-absorbing glue 62 is filled between the pixel definition layer 30 and the cover plate 50 and covers at least a portion of the first protrusions 31. The filling glue 61 covers a rest portion of the first protrusions 31. Specifically, in this embodiment, the moisture-absorbing glue 62 completely covers the first protrusion 31, and the filling glue 61 does not cover the first protrusion 31. That is, the moisture-absorbing glue 62 covers the second protrusion 31. The encapsulation part 40 is separated from the filling glue 61, so that the moisture-absorbing glue 62 absorbs water vapor to prevent the water vapor from entering the filling glue 61.

Figure 9:
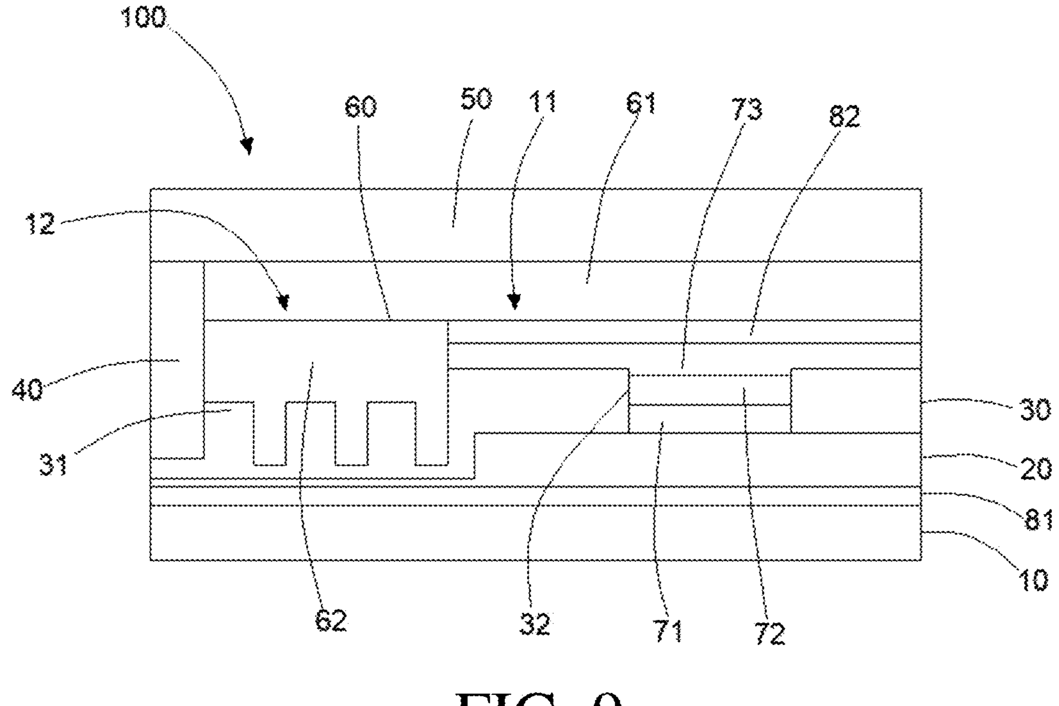
FIG. 9 is a schematic diagram of an eighth structure of an OLED display panel provided by the present application.

Please refer to FIG. 9, which is a schematic diagram of an eighth structure of an OLED display panel 100 provided by the present application. The difference between this embodiment and the OLED display panel 100 provided in FIG. 8 is that the filling glue 61 is formed to extend from the display area 11 to the frame area 12 and is abutted against the second encapsulation part 40. The moisture-absorbing glue 62 is filled between a portion of the filling glue 61 in the frame area 12 and the pixel definition layer 30, and the moisture-absorbing glue 62 covers the first protrusion 31.

That is, in this embodiment, the moisture-absorbing glue 62 does not separate the second encapsulation part 40 from the filling glue 61, but the filling glue 61 extends from the display area 11 to the frame area 12, so that the filling glue 61 extends from the display area 11 to the frame area 12. Therefore, the 61 glue can enhance the mechanical strength of the OLED display panel 100 in the frame area 12.

The above is a detailed introduction to an OLED display panel and a fabrication method of the OLED display panel provided by the embodiments of the present application. Specific examples are used in this article to illustrate the principles and implementations of the present application. The description of the above embodiments is only used to help understand the present application The method of application and its core idea; meanwhile, for those skilled in the art, according to the idea of this application, there will be changes in the specific implementation and the scope of application. In summary, the content of this specification should not be understood as Restrictions on this application.

What is claimed is:

1. An OLED display panel including a pixel definition layer having protrusions, comprising:

- a substrate, wherein the substrate comprises a display area and a frame area arranged on a periphery of the display area;
- a planarization layer, wherein the planarization layer is provided on the substrate;
- the pixel definition layer, wherein the pixel definition layer is provided on the planarization layer, and the pixel definition layer is provided with a first protrusion in the frame area;
- a cover plate, wherein the cover plate is located on a side of the substrate where the pixel definition layer is provided, and is disposed opposite to the substrate;
- a first encapsulation part, wherein the first encapsulation part is filled between the pixel definition layer and the cover plate and extends from the display area to the frame area, and the first encapsulation part at least covers a portion of the first protrusion; and
- a second encapsulation part, wherein the second encapsulation part is filled between the pixel definition layer and the cover plate and is arranged around the first encapsulation part;
- wherein the planarization layer is provided with a second protrusion in the frame area, and a portion of the pixel definition layer in the frame area covers the second protrusion.

2. The OLED display panel according to claim 1, wherein the OLED display panel further comprises a first electrode layer, the first electrode layer is provided on the planarization layer, the pixel definition layer is provided on the a first electrode layer, the first electrode layer comprises an anode and the second protrusion, the pixel definition layer is provided with an opening in the display area, the anode is arranged in the opening, the second protrusion is located in the frame area, and a portion of the pixel definition layer in the frame area covers the second protrusion.

3. The OLED display panel according to claim 2, wherein the first protrusion covers the second protrusion.

4. The OLED display panel according to claim 2, wherein a number of the first protrusion is at least two, portion located between adjacent first protrusions of the pixel definition layer is a recessed portion, and the recessed portion covers the second protrusion.

5. The OLED display panel according to claim 1, wherein the second encapsulation part comprises a frame glue, and the first encapsulation part comprises a filling glue.

6. The OLED display panel according to claim 5, wherein the first encapsulation part further comprises a moisture-absorbing glue, the moisture-absorbing glue is filled in the frame area, and the second encapsulation part is located in the frame area and arranged around the filling glue and the moisture-absorbing glue.

7. The OLED display panel according to claim 6, wherein the moisture-absorbing glue is disposed between the second encapsulation part and the filling glue, the moisture-absorbing glue is filled between the pixel definition layer and the cover plate and covers at least a portion of the first protrusion, and the filling glue covers a rest portion of the first protrusion.

8. The OLED display panel according to claim 6, wherein the filling glue extends from the display area to the frame area and is abutted against the second encapsulation part, the moisture-absorbing glue is filled between a portion of the filling glue in the frame area and the pixel definition layer, and the moisture-absorbing glue covers the first protrusion.

9. The OLED display panel according to claim 1, wherein the pixel definition layer comprises a first pixel definition layer and a second pixel definition layer, the first pixel definition layer covers the planarization layer, the second pixel definition layer is disposed on the first pixel definition layer and located in the display area, and a portion of the first pixel definition layer in the frame area is provided with the first protrusion.

10. An OLED display panel including a pixel definition layer having protrusions, comprising:

- a substrate, wherein the substrate comprises a display area and a frame area arranged on a periphery of the display area;
- a planarization layer, wherein the planarization layer is provided on the substrate;
- the pixel definition layer, wherein the pixel definition layer is provided on the planarization layer, and the pixel definition layer is provided with a first protrusion in the frame area;
- a cover plate, wherein the cover plate is located on a side of the substrate where the pixel definition layer is provided, and is disposed opposite to the substrate;
- a first encapsulation part, wherein the first encapsulation part is filled between the pixel definition layer and the cover plate and extends from the display area to the frame area, and the first encapsulation part at least covers a portion of the first protrusion; and a second encapsulation part, wherein the second encapsulation part is filled between the pixel definition layer and the cover plate and is arranged around the first encapsulation part, and moisture-absorbing particles are added in the second encapsulation part.

11. The OLED display panel according to claim 10, wherein the OLED display panel further comprises a first electrode layer, the first electrode layer is provided on the planarization layer, the pixel definition layer is provided on the a first electrode layer, the first electrode layer comprises an anode and a second protrusion, the pixel definition layer is provided with an opening in the display area, the anode is arranged in the opening, the second protrusion is located in the frame area, and a portion of the pixel definition layer in the frame area covers the second protrusion.

12. The OLED display panel according to claim 10, wherein the planarization layer is provided with a second protrusion in the frame area, and a portion of the pixel definition layer in the frame area covers the second protrusion.

13. The OLED display panel according to claim 11, wherein the first protrusion covers the second protrusion.

14. The OLED display panel according to claim 11, wherein a number of the first protrusion is at least two, portion located between adjacent first protrusions of the pixel definition layer is a recessed portion, and the recessed portion covers the second protrusion.

15. The OLED display panel according to claim 10, wherein the second encapsulation part comprises a frame glue, and the first encapsulation part comprises a filling glue.

16. The OLED display panel according to claim 15, wherein the first encapsulation part further comprises a moisture-absorbing glue, the moisture-absorbing glue is filled in the frame area, and the second encapsulation part is located in the frame area and arranged around the filling glue and the moisture-absorbing glue.

17. The OLED display panel according to claim 16, wherein the moisture-absorbing glue is disposed between the second encapsulation part and the filling glue, the moisture-absorbing glue is filled between the pixel definition layer and the cover plate and covers at least a portion of the first protrusion, and the filling glue covers a rest portion of the first protrusion.

18. The OLED display panel according to claim 16, wherein the filling glue extends from the display area to the frame area and is abutted against the second encapsulation part, the moisture-absorbing glue is filled between a portion of the filling glue in the frame area and the pixel definition layer, and the moisture-absorbing glue covers the first protrusion.

* * * * *